(12) United States Patent
Chen et al.

(10) Patent No.: US 10,297,691 B2
(45) Date of Patent: May 21, 2019

(54) METHOD FOR FORMING SEMICONDUCTOR DEVICE WITH P/N STACKED LAYERS

(71) Applicant: TAIWAN SEMICONDUCTOR MANUFACTURING CO., LTD., Hsinchu (TW)

(72) Inventors: Hung-Pin Chen, Kaohsiung (TW); Chi-Cherng Jeng, Tainan (TW); Ru-Shang Hsiao, Hsinchu County (TW); Li-Yi Chen, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/805,028

(22) Filed: Nov. 6, 2017

(65) Prior Publication Data
US 2018/0076314 A1 Mar. 15, 2018

Related U.S. Application Data

(62) Division of application No. 15/367,054, filed on Dec. 1, 2016, now Pat. No. 9,842,932.

(Continued)

(51) Int. Cl.
*H01L 29/78* (2006.01)
*H01L 21/265* (2006.01)
(Continued)

(52) U.S. Cl.
CPC ...... *H01L 29/785* (2013.01); *H01L 21/26506* (2013.01); *H01L 21/30604* (2013.01); *H01L 21/845* (2013.01); *H01L 27/1211* (2013.01);
*H01L 29/16* (2013.01); *H01L 29/36* (2013.01); *H01L 29/41791* (2013.01); *H01L 29/42356* (2013.01); *H01L 29/66439* (2013.01);
(Continued)

(58) Field of Classification Search
None
See application file for complete search history.

(56) References Cited

U.S. PATENT DOCUMENTS

| | | | | |
|---|---|---|---|---|
| 7,202,494 B2 * | 4/2007 | Blanchard | ............. | B82Y 10/00 257/15 |
| 7,723,797 B2 * | 5/2010 | Kim | .................... | H01L 29/7856 257/368 |

(Continued)

OTHER PUBLICATIONS

Jaehoon Jang et al., "Vertical Cell Array using TCAT(Terabit Cell Array Transistor) Technology for Ultra High Density NAND Flash Memory", Symposium on VLSI Technology Digest of Technical Papers p. 192-193, 2009.

(Continued)

*Primary Examiner* — Bilkis Jahan
(74) *Attorney, Agent, or Firm* — Maschoff Brennan

(57) ABSTRACT

A semiconductor device is provided and includes a semiconductor fin protruding from a semiconductor substrate. The semiconductor fin includes plural pairs of semiconductor layers on the semiconductor substrate, each pair of semiconductor layers consists of a first semiconductor layer of a first conductivity type, and a second semiconductor layer of a second conductivity type. The second semiconductor layer is stacked on and contacts the first semiconductor layer.

20 Claims, 8 Drawing Sheets

Related U.S. Application Data

(60) Provisional application No. 62/342,127, filed on May 26, 2016.

(51) Int. Cl.

| | | |
|---|---|---|
| *H01L 21/306* | (2006.01) | |
| *H01L 29/16* | (2006.01) | |
| *H01L 29/36* | (2006.01) | |
| *H01L 29/417* | (2006.01) | |
| *H01L 29/423* | (2006.01) | |
| *H01L 29/66* | (2006.01) | |
| *H01L 21/84* | (2006.01) | |
| *H01L 27/12* | (2006.01) | |
| *H01L 29/775* | (2006.01) | |
| *H01L 29/06* | (2006.01) | |

(52) U.S. Cl.
CPC .... *H01L 29/66795* (2013.01); *H01L 29/0673* (2013.01); *H01L 29/775* (2013.01); *H01L 2029/7857* (2013.01)

(56) References Cited

U.S. PATENT DOCUMENTS

| | | | | |
|---|---|---|---|---|
| 8,373,238 | B2* | 2/2013 | Lee | H01L 21/823431 |
| | | | | 257/401 |
| 2006/0292765 | A1* | 12/2006 | Blanchard | B82Y 10/00 |
| | | | | 438/157 |
| 2006/0292889 | A1* | 12/2006 | Blanchard | B82Y 10/00 |
| | | | | 438/761 |
| 2007/0145431 | A1* | 6/2007 | Kim | H01L 29/42392 |
| | | | | 257/288 |
| 2008/0227241 | A1* | 9/2008 | Nakabayashi | H01L 21/845 |
| | | | | 438/150 |

OTHER PUBLICATIONS

Hang-Ting Lue et al., "A Highly Scalable 8-Layer 3D Vertical-Gate (VG) TFT NAND Flash Using Junction-Free Buried Channel BE-SONOS Device", Symposium on VLSI Technology Digest of Technical Papers p. 131-132, 2010.

Yi-Hsien Lu, et al., "Novel GAA Raised Source / Drain Sub-10-nm Poly-Si NW Channel TFTs with Self-Aligned Corked Gate Structure for 3-D IC Applications", Symposium on VLSI Technology Digest of Technical Papers p. 142-143, 2011.

Hung-Bin Chen, et al., "Performance of GAA poly-Si Nanosheet (2nm) channel of Junctionless Transistors with ideal Subthreshold Slope", Symposium on VLSI Technology Digest of Technical Papers T232-233, 2013.

Ya-Chi Cheng, et al., "Performance Enhancement of a Novel P-type Junctionless Transistor Using a Hybrid Poly-Si Fin Channel", IEEE IEDM14-622, 2014.

Y.-J. Lee, et al., "A Novel Junctionless FinFET Structure with Sub-5nm Shell Doping Profile by Molecular Monolayer Doping and Microwave Annealing", IEEE IEDM14-788, 2014.

Mu-Shih Yeh, et al., "High Performance Ultra-Thin Body (2.4nm) Poly-Si Junctionless Thin Film Transistors with a Trench Structure", IEEE IEDM14-618, 2014.

Po-Yi Kuo, et al., "Implantation Free GAA Double Spacer Poly-Si Nanowires Channel Junctionless FETs with Sub-1V Gate Operation and Near Ideal Subthreshold Swing", IEEE IEDM15-133, 2015.

* cited by examiner

METHOD FOR FORMING SEMICONDUCTOR DEVICE WITH P/N STACKED LAYERS

RELATED APPLICATIONS

This application is a divisional of U.S. patent application Ser. No. 15/367,054 filed on Dec. 1, 2016, which claims priority to U.S. provisional application Ser. No. 62/342,127 filed on May 26, 2016. All of these applications are incorporated herein by reference in their entireties.

BACKGROUND

The semiconductor integrated circuit (IC) industry has experienced rapid growth. In the course of the IC evolution, functional density (defined as the number of interconnected devices per chip area) has generally increased while geometry size (i.e., the smallest component (or line) that can be created using a fabrication process) has decreased. A scaling down process generally provides benefits by increasing production efficiency and lowering associated costs. But, such scaling down has increased the complexity of processing and manufacturing ICs. For these advances to be realized, similar developments in IC manufacturing are needed.

As the semiconductor IC industry has progressed into nanometer technology process nodes in pursuit of higher device density, higher performance, and lower costs, challenges from both fabrication and design have resulted in the development of three-dimensional (3D) devices such fin-like field effect transistors (FinFETs). Advantages of FinFET devices include reducing the short channel effect and higher current flow. There has been a desire to use a FinFET device with a high-k gate dielectric and metal gate electrode to improve device performance as feature sizes continue to decrease. As many critical scaling limits become more difficult to overcome, a stacked FinFET structure is one of promising ways to sustain scaling. However, conventional stacked FinFET devices and methods of fabricating the stacked FinFET devices have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
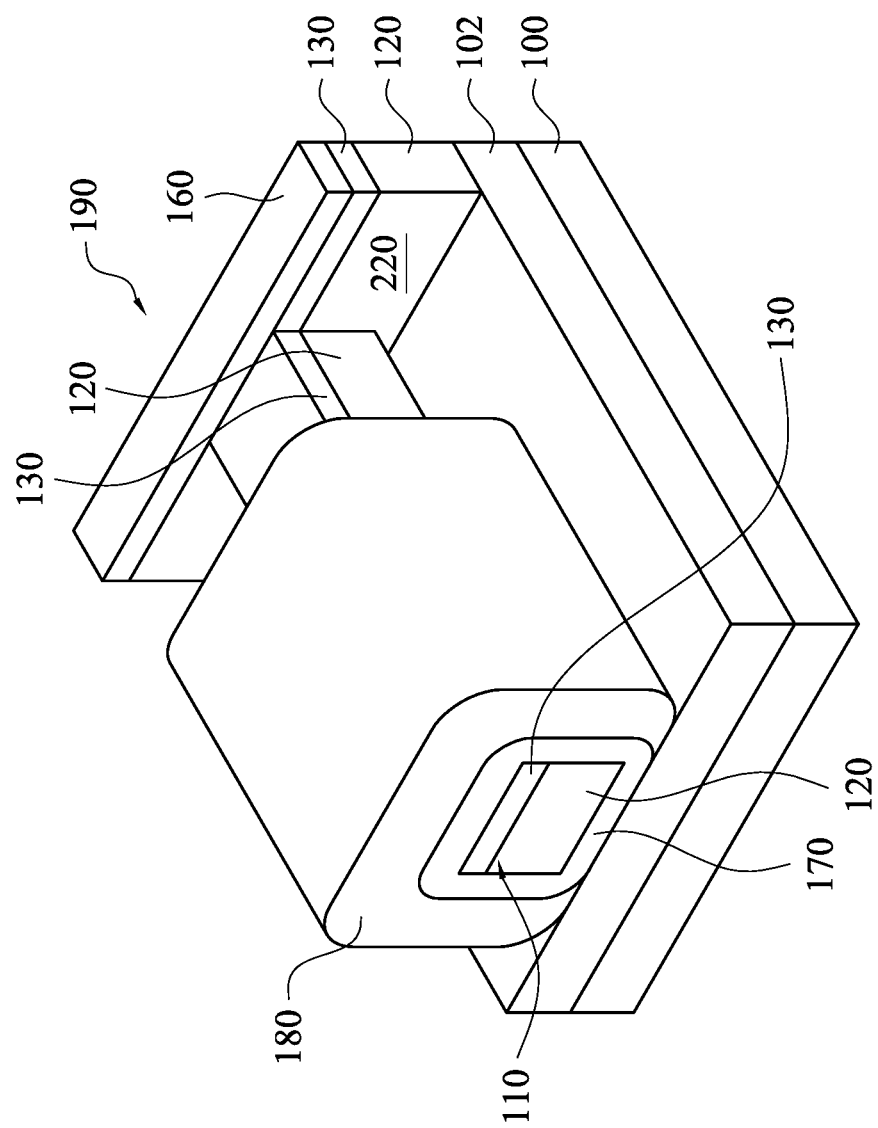
FIG. 1 is a schematic 3D diagram of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. In addition, the present disclosure may repeat reference numerals and/or letters in the various examples. This repetition is for the purpose of simplicity and clarity and does not in itself dictate a relationship between the various embodiments and/or configurations discussed. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

It will be understood that, although the terms "first", "second", "third", etc., may be used in the claims to describe various elements, these elements should not be limited by these terms, and these elements correspondingly described in the embodiments are presented by different reference numbers. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Embodiments of the present disclosure are directed to a FinFET with multi-stacking hybrid P/N types of semiconductor layers and a manufacturing method thereof, and more particularly to a three-dimensional (3D) stacked hybrid P/N (or N/P) types of semiconductor layers for p-channel (or n-channel) junctionless thin-film transistor (JL-TFT) with nanowire (NW) structures. For manufacturing a p-type metal-oxide-silicon filed-effect transistor (PMOS) device, embodiments of the present disclosure includes at least one pair of a p-type semiconductor layer and n-type semiconductor layer underlying the p-type semiconductor layer, in which the n-type semiconductor layer between the vertically stacked p-type semiconductor layers produces an additional depletion region, such that the effective channel thickness is reduced to strengthen the gate controllability. For manufacturing an n-type metal-oxide-silicon filed-effect transistor (NMOS) device, embodiments of the present disclosure includes at least one pair of an n-type semiconductor layer and a p-type semiconductor layer underlying the n-type semiconductor layer, in which the p-type semiconductor layer between the vertically stacked n-type semiconductor layers produces an additional depletion region, such that the effective channel thickness is reduced to strengthen the gate controllability.

Referring to FIG. 1, FIG. 1 is a schematic 3D diagram of a semiconductor device in accordance with some embodiments of the present disclosure. The semiconductor device includes a semiconductor substrate 100, a semiconductor fin 110, a gate oxide 170, a gate electrode 180, a source/drain portion 190, and the other source source/drain portion (not shown). The semiconductor substrate 100 is defined as any construction including semiconductor materials, including, but is not limited to, bulk silicon, a semiconductor wafer, or a silicon germanium (SiGe) substrate. Other semiconductor materials including group III, group IV, and group V elements may also be used. Each of the source/drain portions, for example the source/drain portion 190, includes an end portion of the semiconductor fin 110 and a contact portion 160 overlying the semiconductor fin 110. The source/drain portion 190 is disposed on the semiconductor fin 110 adjacent to one side of the gate electrode 180, and the other source source/drain portion is disposed on the semiconductor fin 110 adjacent to the other side of the gate electrode 180. The gate oxide 170 is disposed between the source/drain portion 190 and the other source source/drain portion, and covers sides surfaces and top surface of the semiconductor fin 110, and the gate electrode 180 covers side surfaces and top surface of the gate oxide 170. In some embodiments, the gate electrode 180 may be an omegagate. However, different types of gate electrode are suitable for use in embodiments of the present disclosure. Thus, the source/drain portions together with the gate electrode form a FinFET device.

The semiconductor fin 110 includes a first semiconductor layer 120 of a first conductivity type and a second semiconductor layer 130 of a second conductivity type. The first semiconductor layer 120 and the second semiconductor layer 130 are defined as any construction including semiconductor materials, including, but is not limited to, bulk silicon, a semiconductor wafer, or a silicon germanium (SiGe) substrate. Other semiconductor materials including group III, group IV, and group V elements may also be used. The first semiconductor layer 120 of the first conductivity type is disposed on the semiconductor substrate 100, in which the first semiconductor layer 120 comprises one of an n type dopant and a p type dopant. The second semiconductor layer 130 of the second conductivity type is stacked on and in contact with the first semiconductor layer, in which the second semiconductor layer 130 comprises the other one of the n type dopant and the p type dopant. For example, when the first semiconductor layer 120 includes the n type dopant and the second semiconductor layer 130 includes the p type dopant, the semiconductor fin 110 has a PN structure, and the second semiconductor layer 130 corresponds to a PMOS device. When the first semiconductor layer 120 includes the p type dopant and the second semiconductor layer 130 includes the n type dopant, the semiconductor fin 110 has an NP structure, and the second semiconductor layer 130 corresponds to an NMOS device. In some embodiments, the semiconductor device further includes an isolation layer 102, such as tetraethyl orthosilicate (TEOS), disposed on the semiconductor substrate 100. In that case, the first semiconductor layer 120 of the first conductivity type is disposed on the isolation layer 102. In some embodiments, the semiconductor fin 110 is formed by directly processing the semiconductor substrate 100, such as a bulk FinFET structure, in which the first semiconductor layer 120 of the first conductivity type is directly disposed on the semiconductor substrate 100.

The semiconductor device of the present disclosure may be a junctionless thin-film transistor (JL-TFT), a junctionless field effect transistor (JL-FET), an inversion mode TFT or FET, or an accumulation mode TFT or FET. The thickness of the first semiconductor layer 120 and the second semiconductor layer 130 is determined by the type of the semiconductor device and the ion concentrations of the first semiconductor layer 120 and the second semiconductor layer 130. In some embodiments, a thickness ratio of the first semiconductor layer to the second semiconductor layer is substantially in a range from 0.01 to 100. In certain embodiments, the thickness ratio is substantially in a range from 0.1 to 10. For example, a thickness of the first semiconductor layer 120 is about 300 Angstrom, and a thickness of the second semiconductor layer 130 is about 150 Angstrom), and thus the thickness ratio is 2. In some embodiments, the second semiconductor layer 130 has an average boron concentration substantially in a range from $1 \times 10^{16}/cm^3$ to $1 \times 10^{20}/cm^3$, for example $5 \times 10^{19}/cm^3$, and the first semiconductor layer 120 has an average phosphorous concentration substantially in a range from $1 \times 10^{16}/cm^3$ to $1 \times 10^{20}/cm^3$, for example $4 \times 10^{19}/cm^3$. Because the first semiconductor layer 120 is of a conductivity type (such as an n type) opposite to a conductivity type (such as a p type) of the second semiconductor layer 130, a depletion region is produced at the p/n junction between the first semiconductor layer 120 and the second semiconductor layer 130, and thus the effective channel thickness is reduced to strengthen the controllability of the gate over that in a conventional JL-TFT, and the semiconductor device shown in FIG. 1 has good electrical performance. In some embodiments, the first semiconductor layer 120 and the second semiconductor layer 130 may be formed from silicon or SiGe. Thus, the semiconductor device shown in FIG. 1 has good thermal conductivity due to good Si thermal conductivity, and has good device variability robustness in processes of forming silicon or SiGe layers. Accordingly, the stacked hybrid P/N (or N/P) structure shown in FIG. 1 is a highly promising architecture for 3D stacked ICs and memory applications due to good Si thermal conductivity, gate controllability and device variability robustness in process and electrical performance.

Figure 2:
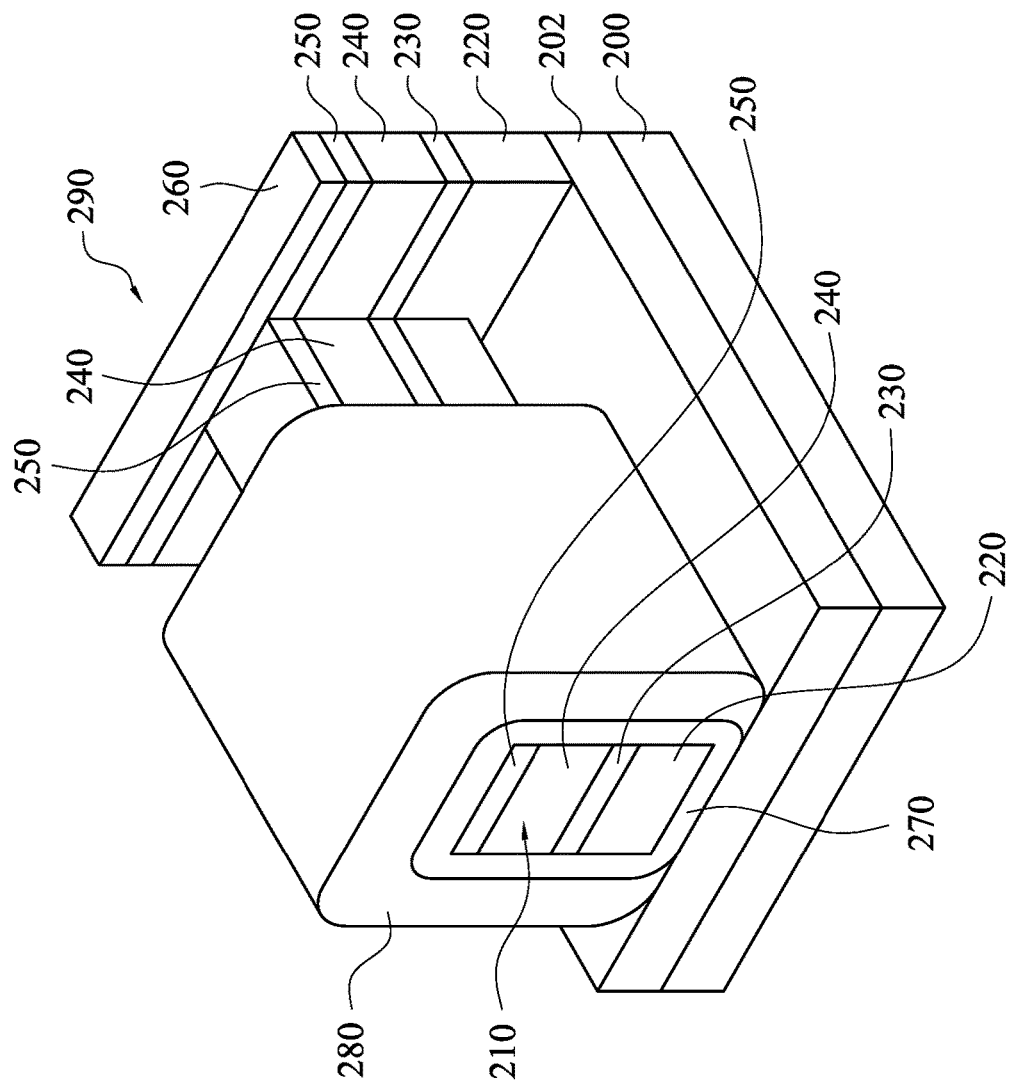
FIG. 2 is a schematic 3D diagram of a semiconductor device in accordance with certain embodiments of the present disclosure.

Referring to FIG. 2, FIG. 2 is a schematic 3D diagram of a semiconductor device in accordance with certain embodiments of the present disclosure. The semiconductor device includes a semiconductor substrate 200, a semiconductor fin 210, a gate oxide 270, a gate electrode 280, a source/drain portion 290, and the other source source/drain portion (not shown). The semiconductor substrate 200 is defined as any construction including semiconductor materials, including, but is not limited to, bulk silicon, a semiconductor wafer, or a silicon germanium (SiGe) substrate. Other semiconductor materials including group III, group IV, and group V elements may also be used. Each of the source/drain portions, for example the source/drain portion 290, includes an end portion of the semiconductor fin 210 and a contact portion 260 overlying the semiconductor fin 210. The source/drain portion 290 is disposed on the semiconductor fin 210 adjacent to one side of the gate electrode 280, and the other source source/drain portion is disposed on the semiconductor fin 210 adjacent to the other side of the gate electrode 280. The gate oxide 270 is disposed between the source/drain portion 290 and the other source source/drain portion, and covers sides surfaces and top surface of the semiconductor fin 210, and the gate electrode 280 covers side surfaces and top surface of the gate oxide 270. In some embodiments, the gate electrode 280 may be an omegagate. However, different types of gate electrode are suitable for use in embodiments of the present disclosure. Thus, the source/drain portions together with the gate electrode form a FinFET device.

The semiconductor fin 210 includes a first semiconductor layer 220 of a first conductivity type, a second semiconductor layer 230 of a second conductivity type, a third semiconductor layer 240 of the first conductivity type, and a fourth semiconductor layer 250 of the second conductivity type, in which the first conductivity type is one of an n type and a p type, and the second conductivity type is the other of the n type and the p type. The first semiconductor layer 220 of the first conductivity type is disposed on the semiconductor substrate 200. The second semiconductor layer 230 of the second conductivity type is stacked on and in contact with the first semiconductor layer 220, in which the second conductivity type is the other of the n type and the p type. For example, when the first conductivity type is the n type and the second conductivity type is the p type, the semiconductor fin 210 has a PNPN structure, and the second semiconductor layer 230 and the fourth semiconductor layer 250 are corresponding to respective PMOS devices. When the first conductivity type is the p type and the second conductivity type is the n type, the semiconductor fin 210 has an NPNP structure, and the second semiconductor layer 230 and the fourth semiconductor layer 250 correspond to respective NMOS devices. Therefore, the semiconductor device shown in FIG. 2 includes two MOS devices of the same type. In some embodiments, the semiconductor device further includes an isolation layer 202, such as tetraethyl orthosilicate (TEOS), disposed on the semiconductor substrate 200. In that case, the first semiconductor layer 220 of the first conductivity type is disposed on the isolation layer 202.

In some embodiments, a thickness (such as about 300 Angstrom) of the first semiconductor layer 220 is substantially twice of a thickness (such as about 150 Angstrom) of the second semiconductor layer 230. A thickness (such as about 300 Angstrom) of the third semiconductor layer 240 is substantially twice of a thickness (such as about 150 Angstrom) of the fourth semiconductor layer 250. An average ion concentration of the second semiconductor layer 230 is greater than an average ion concentration of the first semiconductor layer 220. An average ion concentration of the fourth semiconductor layer 250 is greater than an average ion concentration of the third semiconductor layer 240. In some embodiments, each of the second semiconductor layer 230 and the fourth semiconductor layer 250 has an average boron concentration substantially in a range from $1\times10^{16}/cm^3$ to $1\times10^{20}/cm^3$, for example $5\times10^{19}/cm^3$, and each of the first semiconductor layer 220 and the third semiconductor layer 240 has an average phosphorous concentration substantially in a range from $1\times10^{16}/cm^3$ to $1\times10^{20}/cm^3$, for example $4\times10^{19}/cm^3$. Because the first semiconductor layer 220 is of a conductivity type (such as an n type) opposite to a conductivity type (such as a p type) of the second semiconductor layer 230, a depletion region is produced at the p/n junction between the first semiconductor layer 220 and the second semiconductor layer 230. Because the third semiconductor layer 240 is of a conductivity type (such as the n type) opposite to conductivity types (such as the p type) of the second semiconductor layer 230 and the fourth semiconductor layer 250, depletion regions are produced at the p/n junction between the second semiconductor layer 230 and the third semiconductor layer 240, and at the p/n junction between the third semiconductor layer 240 and the fourth semiconductor layer 250. Thus, the second semiconductor layer 230 corresponding to a MOS device and the fourth semiconductor layer 250 corresponding to another MOS device are separated by the third semiconductor layer 240. The effective channel thickness of each MOS device is reduced to strengthen the controllability of the gate over that in a conventional JL-TFT, and the semiconductor device shown in FIG. 2 has good electrical performance. In some embodiments, the first semiconductor layer 220, the second semiconductor layer 230, the third semiconductor layer 240 and the fourth semiconductor layer 250 may be formed from silicon or SiGe. Thus, the semiconductor device shown in FIG. 2 has good thermal conductivity due to good Si thermal conductivity, and has good device variability robustness in processes of forming silicon or SiGe layers. Therefore, the stacked hybrid P/N (or N/P) structure shown in FIG. 2 is a highly promising architecture for 3D stacked ICs and memory applications due to good Si thermal conductivity, gate controllability and device variability robustness in process and electrical performance.

For analyzing the characteristic of the PNPN structure (i.e. the first conductivity type is the n type and the second conductivity type is the p type) shown in FIG. 2, each nanowire of the PNPN structure with about 17 nm high×35 nm wide is made for testing stacked P/N JL-TFTs with an omega-gate. To analyze the doping profile within the stacked hybrid P/N channels (the PNPN structure), a secondary ion mass spectroscopy (SIMS) measurement is performed on an un-patterned Si wafer that is performed through the identical processes except the patterning processes. The p-type semiconductor layers are doped with average boron concentration of $5\times10^{19}$ cm$^{-3}$ and the underlying n-type semiconductor layer is doped with phosphorus concentration of $4\times10^{19}$ cm$^{-3}$. The superb transfer characteristics of the stacked P/N JL-TFTs with a channel length (Lg) of 1 μm are as follows: (1) subthreshold swing (SS)=70 mV/dec and (2) $I_{on}/I_{off}$ ratio>$10^9$. The stacked P/N JL-TFTs have the advantages of an additional depletion region between channel/substrate. The stacked P/N JL-TFTs show very high $I_{on}/I_{off}$ ratio over $10^9$ and excellent SS value of 70 mV/dec. Additionally, the PNPN device has less temperature and device performance fluctuation in terms of $V_{th}$ and subthreshold swing (SS).

Figure 3:
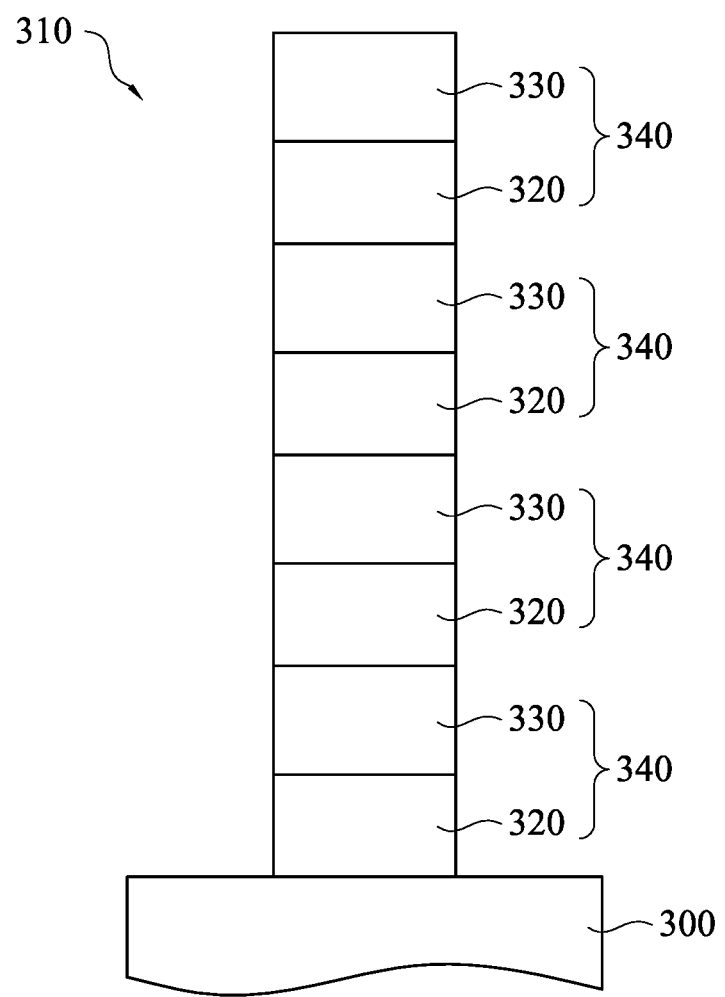
FIG. 3 is a schematic cross-sectional view of a semiconductor fin 310 in accordance with certain embodiments of the present disclosure.

Referring to FIG. 3, FIG. 3 is a schematic cross-sectional view of a semiconductor fin 310 in accordance with certain embodiments of the present disclosure. The semiconductor fin 310 includes plural pairs 340 of semiconductor layers stacked on a semiconductor substrate 300. The semiconductor substrate 200 is defined as any construction including semiconductor materials, including, but is not limited to, bulk silicon, a semiconductor wafer, or a silicon germanium (SiGe) substrate. Other semiconductor materials including group III, group IV, and group V elements may also be used. Each pair 340 of semiconductor layers consists of a first semiconductor layer 320 of a first conductivity type, and a second semiconductor layer 330 of a second conductivity type, in which the first semiconductor layer 320 includes one of an n type dopant and a p type dopant, and the second semiconductor layer 330 includes the other of the n type dopant and the p type dopant. The second semiconductor layer 330 of the second conductivity type is stacked on and in contact with the first semiconductor layer 320. For example, when the first semiconductor layer 320 includes the n type dopant and the second semiconductor layer 330 includes the p type dopant, the second semiconductor layer 330 in each pair 340 of semiconductor layers correspond to a PMOS device. When the first semiconductor layer 320 includes the p type dopant and the second semiconductor layer 330 includes the n type dopant, the second semiconductor layer 330 in each pair 340 of semiconductor layers corresponds to an NMOS device. Therefore, for a k pairs 340 of semiconductor layers (k is a positive integer), the semiconductor device shown in FIG. 3 includes k MOS devices of the same conductivity type. In some embodiments, the semiconductor device further includes an isolation layer (not shown), such as tetraethyl orthosilicate (TEOS). In that case, the semiconductor fin 310 is disposed on the isolation layer.

In some embodiments, a thickness (such as about 300 Angstrom) of the first semiconductor layer 320 is substantially twice of a thickness (such as about 150 Angstrom) of the second semiconductor layer 330. An average ion concentration of the second semiconductor layer 330 is greater than an average ion concentration of the first semiconductor layer 320. In some embodiments, the second semiconductor layer 330 has an average boron concentration substantially in a range from $1 \times 10^{16}/cm^3$ to $1 \times 10^{20}/cm^3$, for example $5 \times 10^{19}/cm^3$, and the first semiconductor layer 320 has an average phosphorous concentration substantially in a range from $1 \times 10^{16}/cm^3$ to $1 \times 10^{20}/cm^3$, for example $4 \times 10^{19}/cm^3$. Because the first semiconductor layer 320 is of a conductivity type (such as an n type) opposite to a conductivity type (such as a p type) of the second semiconductor layer 330, depletion regions are produced at a p/n junction between the first semiconductor layer 320 and the second semiconductor layer 330, and at another p/n junction between the second semiconductor layer 330 and its overlying first semiconductor layer 320 of the overlying pair 340 of semiconductor layers. Thus, the second semiconductor layer 330 (corresponding to a MOS device) of each pair 340 of semiconductor layers is separated by its adjoining first semiconductor layers 320. The effective channel thickness of each MOS device is reduced to strengthen the controllability of the gate over that in a conventional JL-TFT, and the semiconductor device shown in FIG. 3 has good electrical performance. In some embodiments, the first semiconductor layer 320 and the second semiconductor layer 330 may be formed from silicon or SiGe. Thus, the semiconductor device shown in FIG. 3 has good thermal conductivity due to good Si thermal conductivity, and has good device variability robustness in processes of forming silicon or SiGe layers. Accordingly, the stacked hybrid P/N (or N/P) structure shown in FIG. 3 is a highly promising architecture for 3D stacked ICs and memory applications due to good Si thermal conductivity, gate controllability and device variability robustness in process and electrical performance.

Figure 4A:
FIG. 4A to FIG. 4H are schematic cross-sectional views of intermediate stages showing a method for fabricating a semiconductor device in accordance with some embodiments of the present disclosure.
Figure 4B:
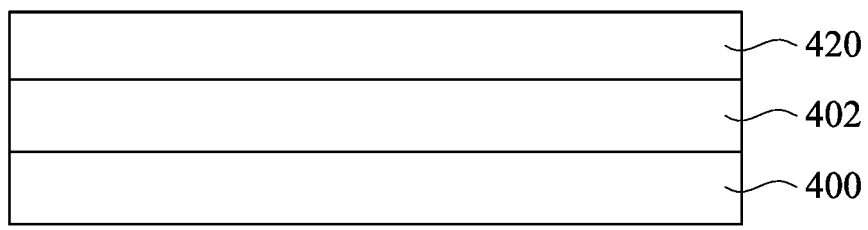
Figure 4C:
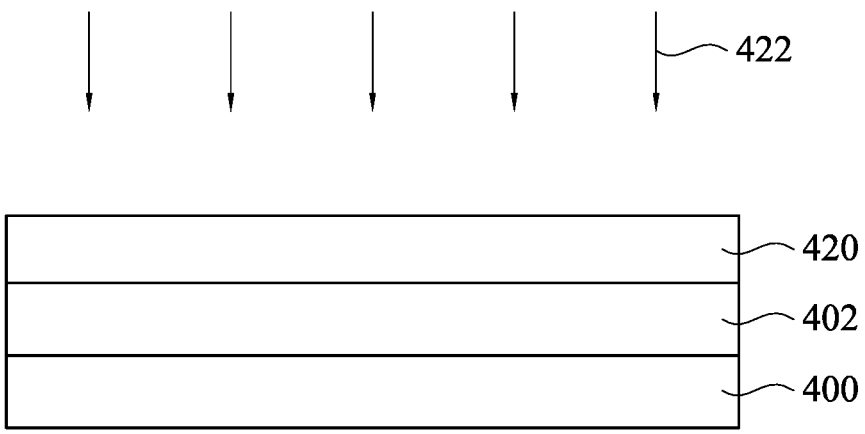
Figure 4D:
Figure 4E:
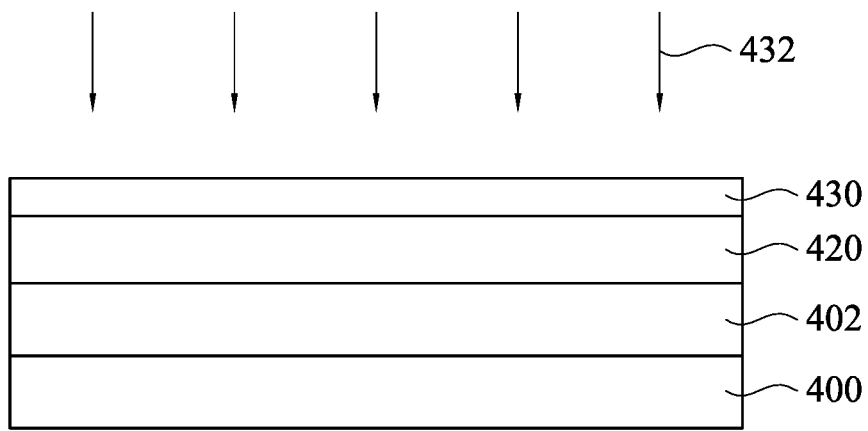
Figure 4F:
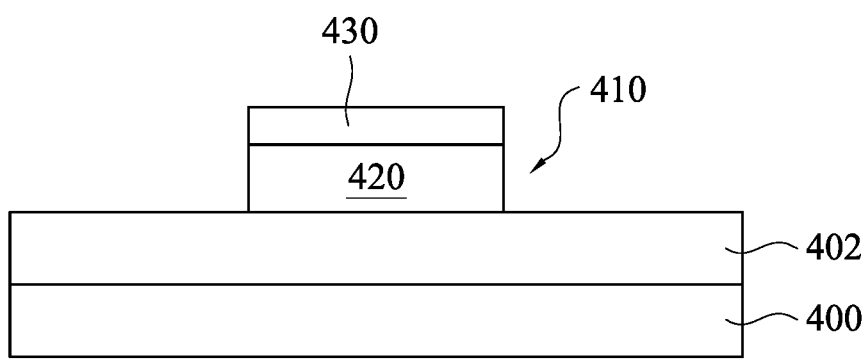
Figure 4G:
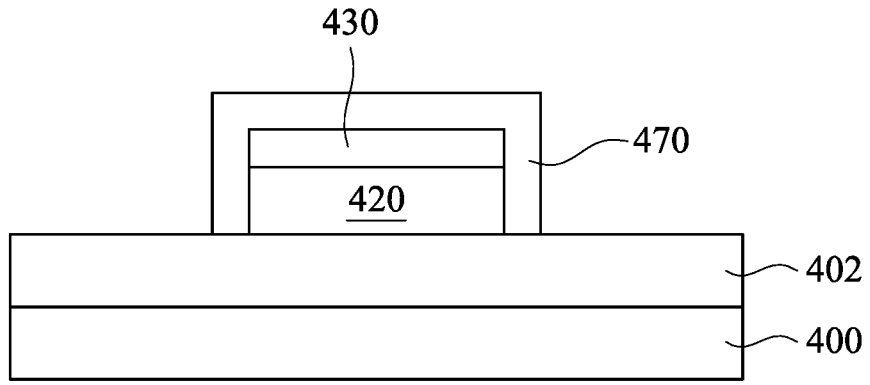
Figure 4H:
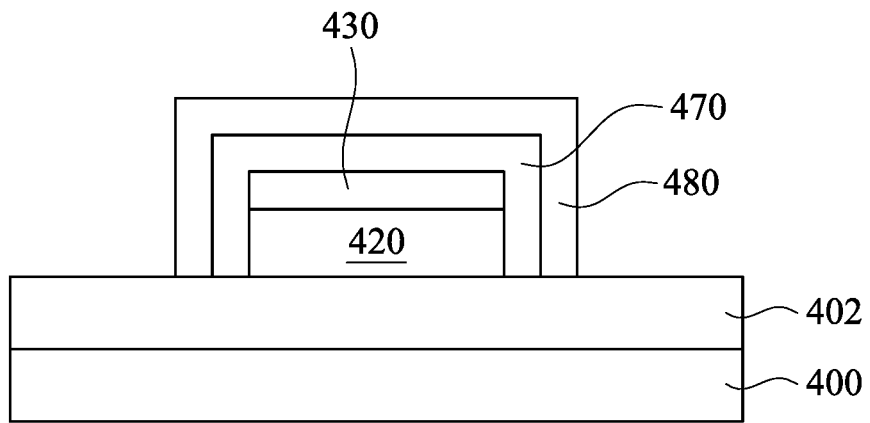
Figure 5:
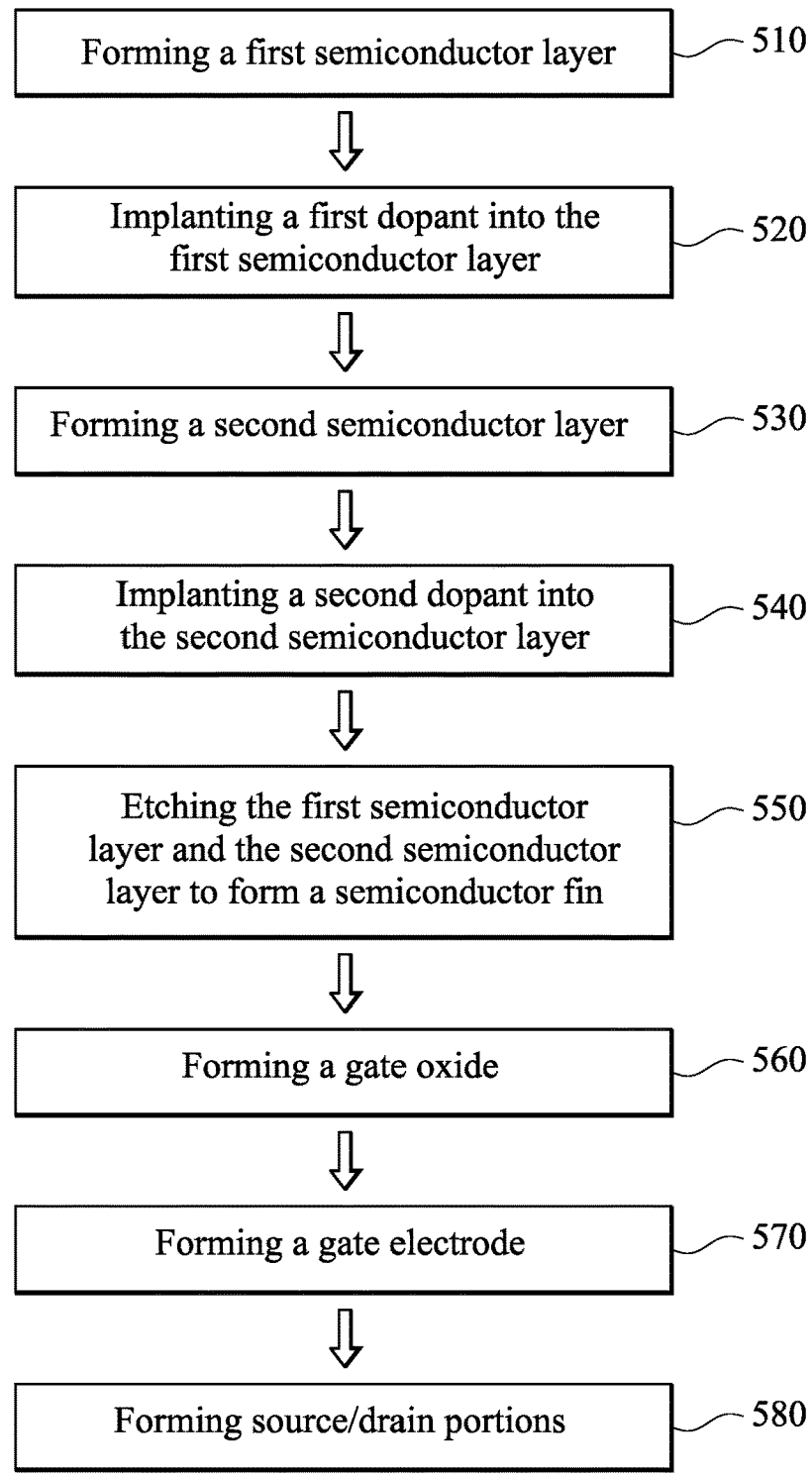
FIG. 5 is a flow chart showing a method for fabricating a semiconductor device in accordance with some embodiments of the present disclosure.

Referring to FIG. 5 together with FIG. 4A to FIG. 4H, FIG. 5 is a flow chart showing a method 500 for fabricating a semiconductor device in accordance with some embodiments of the present disclosure, and FIG. 4A to FIG. 4H are schematic cross-sectional views of intermediate stages showing a method for fabricating a semiconductor device in accordance with some embodiments of the present disclosure. As shown in FIG. 4A, when the method 500 begins, a semiconductor substrate 400 is provided, and an isolation layer 402, such as tetraethyl orthosilicate (TEOS), is optionally formed on the semiconductor substrate 400. The semiconductor substrate 100 is defined as any construction including semiconductor materials, including, but is not limited to, bulk silicon, a semiconductor wafer, or a silicon germanium (SiGe) substrate. Other semiconductor materials including group III, group IV, and group V elements may also be used.

As shown in FIG. 4B, at operation 510, a first semiconductor layer 420 is formed on the isolation layer 402. The first semiconductor layer 420 is formed from such as silicon or silicon-germanium. In some embodiments, an epitaxy or epitaxial (epi) process is used to form the first semiconductor layer 420. The epi process may include a selective epitaxy growth (SEG) process, CVD deposition techniques (e.g., vapor-phase epitaxy (VPE) and/or ultra-high vacuum CVD (UHV-CVD)), molecular beam epitaxy, other suitable epi processes, or combinations thereof. Then, as shown in FIG. 4C, an operation 520 is performed to implant a first dopant 422 of a first dopant type into the first semiconductor layer 410, in which the first dopant type is one of an n type and a p type. In some examples, the p-type dopant is boron or $BF_2$, and the n-type dopant is phosphorus or arsenic, or a combination thereof. The operation 520 is performed at a dopant dose of about $2 \times 10^{14}/cm^2$, for example.

As shown in FIG. 4D, at operation 530, a second semiconductor layer 430 is formed on and contacts the first semiconductor layer 420. The second semiconductor layer 430 is formed from such as silicon or silicon-germanium. In some embodiments, an epitaxy or epitaxial (epi) process is used to form the first semiconductor layer 420. The epi process may include a selective epitaxy growth (SEG) process, CVD deposition techniques (e.g., vapor-phase epitaxy (VPE) and/or ultra-high vacuum CVD (UHV-CVD)), molecular beam epitaxy, other suitable epi processes, or combinations thereof.

Then, as shown in FIG. 4E, an operation 540 is performed to implant a second dopant 432 of a second dopant type into the second semiconductor layer 430, in which the second dopant type is one of the n type and the p type. In some examples, the p-type dopant is boron or $BF_2$, and the n-type dopant is phosphorus or arsenic, or a combination thereof. For example, when the first dopant is an n-type dopant, the second dopant is a p-type dopant; and when the first dopant is a p-type dopant, the second dopant is an n-type dopant. The operation 540 is performed at a dopant dose of $2 \times 10^{14}/cm^2$, for example. The operations 520 to 540 form a pair of semiconductor layers (a PN or NP structure) as shown in FIG. 1. In some embodiments, a thickness (such as about 300 Angstrom) of the first semiconductor layer 420 is substantially twice of a thickness (such as about 150 Angstrom) of the second semiconductor layer 430. An average ion concentration of the second semiconductor layer 430 is greater than an average ion concentration of the first semiconductor layer 420. In some embodiments, the second semiconductor layer 430 has an average boron concentration substantially in a range from $1 \times 10^{16}/cm^3$ to $1 \times 10^{20}/cm^3$, for example $5 \times 10^{19}/cm^3$, and the first semiconductor layer 420 has an average phosphorous concentration substantially in a range from $1 \times 10^{16}/cm^3$ to $1 \times 10^{20}/cm^3$, for example $4 \times 10^{19}/cm^3$.

The operations 520 to 540 can be repeated twice to form two pairs of semiconductor layers (a PNPN or NPNP structure) corresponding to two MOS devices as shown in FIG. 2. The operations 520 to 540 can be repeated for k times to form k pairs of semiconductor layers (a PNPN or NPNP structure) corresponding to k MOS devices as shown in FIG. 3, in which k is a positive integer.

Thereafter, as shown in FIG. 4F, at operation 550, the first semiconductor layer 420 and the second semiconductor layer 430 are etched by using a masking layer (not shown) along with a suitable etching process, so as to form a semiconductor fin 410. As shown in FIG. 4G, at operation 560, a gate oxide 470 is formed to cover side surfaces and top surface of the semiconductor fin 410. As shown in FIG. 4H, at operation 570, the gate electrode 480 is formed to cover side surfaces and top surface of the gate oxide 470. In some embodiments, the gate electrode 480 may be an omegagate. Thereafter, at operation 580, source/drain portions are formed on both ends of the semiconductor fin and sandwich the gate electrode. Thus, the source/drain portions together with the gate electrode form a FinFET device.

In accordance with some embodiments, a semiconductor device includes a semiconductor substrate, and a semiconductor fin protruding from the semiconductor substrate. The semiconductor fin includes a first semiconductor layer of a first conductivity type and a second semiconductor layer of a second conductivity type. The first semiconductor layer of the first conductivity type is disposed on the semiconductor substrate. The second semiconductor layer of the second conductivity type is stacked on and in contact with the first semiconductor layer.

In accordance with certain embodiments, a semiconductor device includes a semiconductor substrate, and a semiconductor fin protruding from the semiconductor substrate. The semiconductor fin includes plural pairs of semiconductor layers on the semiconductor substrate. Each of the pairs of semiconductor layers consists of a first semiconductor layer of a first conductivity type and a second semiconductor layer of a second conductivity type. The second semiconductor layer of the second conductivity type is stacked on and in contact with the first semiconductor layer.

In accordance with some embodiments, a method for forming a semiconductor device includes the following steps. A first semiconductor layer is formed on a semiconductor substrate. A first dopant of a first dopant type is implanted into the first semiconductor layer, in which the first dopant type is one of an n type and a p type. A second semiconductor layer is formed on and contacts the first semiconductor layer. A second dopant of a second dopant type is implanted into the second semiconductor layer, in which the second dopant type is one of the n type and the p type. The first semiconductor layer and the second semiconductor layer are etched to form a semiconductor fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, the method comprising:
    performing at least one operation to form at least one pair of semiconductor layers on a semiconductor substrate, each of the at least one pair of semiconductor layers consisting of a first semiconductor layer and a second semiconductor layer, each of the at least one operation comprising:
        forming the first semiconductor layer on the semiconductor substrate;
        implanting a first dopant into the first semiconductor layer, wherein the first dopant is one of an n type dopant and a p type dopant;
        forming the second semiconductor layer that is on and contacts the first semiconductor layer; and
        implanting a second dopant into the second semiconductor layer, wherein the second dopant is the other of the n type dopant and the p type dopant; and
    etching the at least one pair of semiconductor layers to form a semiconductor fin.

2. The method of claim 1, wherein operations of forming the first semiconductor layer and the second semiconductor layer are performed by depositing silicon or SiGe.

3. The method of claim 1, wherein the first dopant is the n type dopant, and the second dopant is the p type dopant, such that the second semiconductor layer is corresponding to a PMOS device.

4. The method of claim 1, further comprising:
    forming an isolation layer on the semiconductor substrate, wherein the first semiconductor layer is disposed over the isolation layer.

5. The method of claim 1, further comprising:
    forming a gate oxide to cover side surfaces and top surface of the semiconductor fin;
    forming a gate electrode to cover side surfaces and top surface of the gate oxide; and
    forming source/drain portions respectively on the semiconductor fin adjacent to both sides of the gate electrode.

6. A method for forming a semiconductor device, the method comprising:
    performing a plurality of operations to form a plurality of pairs of semiconductor layers on a semiconductor substrate, each of the pairs of semiconductor layers consisting of a first semiconductor layer and a second semiconductor layer, the operations comprising:
        forming the first semiconductor layer of a first pair of semiconductor layers over the semiconductor substrate;
        implanting a first dopant into the first semiconductor layer of the first pair of semiconductor layers, wherein the first dopant is one of an n type dopant and a p type dopant;
        forming the second semiconductor layer of the first pair of semiconductor layers stacked on and in contact with the first semiconductor layer;
        implanting a second dopant into the second semiconductor layer of the first pair of semiconductor layers, wherein the second dopant is the other of the n type dopant and the p type dopant;
        forming the first semiconductor layer of another pair of semiconductor layers stacked on and contacting the second semiconductor layer of an underlying pair of semiconductor layers;
        implanting the first dopant into the first semiconductor layer of the another pair of semiconductor layers;
        forming the second semiconductor layer of the another pair of semiconductor layers stacked on and contacting the first semiconductor layer of the another pair of semiconductor layers; and
        implanting the second dopant into the second semiconductor layer of the another pair of semiconductor layers; and
    etching the plurality of pairs of semiconductor layers to form a semiconductor fin.

7. The method of claim 6, wherein operations of forming the first semiconductor layer and the second semiconductor layer are performed by depositing silicon or SiGe.

8. The method of claim 6, wherein operations of forming the first semiconductor layer and the second semiconductor layer form a thickness of the first semiconductor layer that is substantially twice of a thickness of the second semiconductor layer.

9. The method of claim 6, wherein operations of implanting the first dopant and implanting the second dopant form an average ion concentration of the second semiconductor layer that is greater than an average ion concentration of the first semiconductor layer.

10. The method of claim 6, further comprising:
forming an isolation layer on the semiconductor substrate, wherein the first semiconductor layer of the first pair of semiconductor layers is disposed over the isolation layer.

11. The method of claim 6, further comprising:
forming a gate oxide to cover side surfaces and top surface of the semiconductor fin;
forming a gate electrode to cover side surfaces and top surface of the gate oxide; and
forming source/drain portions respectively on the semiconductor fin adjacent to both sides of the gate electrode.

12. A method for forming a semiconductor device, the method comprising:
performing at least one operation to form at least one pair of semiconductor layers on a semiconductor substrate, each of the at least one pair of semiconductor layers consisting of a first semiconductor layer and a second semiconductor layer, the at least one operation comprising:
forming the first semiconductor layer of a first pair of semiconductor layers over the semiconductor substrate;
implanting a first dopant into the first semiconductor layer of the first pair of semiconductor layers, wherein the first dopant is one of an n type dopant and a p type dopant;
forming the second semiconductor layer of the first pair of semiconductor layers stacked on and in contact with the first semiconductor layer;
implanting a second dopant into the second semiconductor layer, wherein the second dopant is the other of the n type dopant and the p type dopant;
when a number of the at least one operation is more than one, the operations further comprising:
forming the first semiconductor layer of another pair of semiconductor layers stacked on and contacting the second semiconductor layer of an underlying pair of semiconductor layers;
implanting the first dopant into the first semiconductor layer of the another pair of semiconductor layers;
forming the second semiconductor layer of the another pair of semiconductor layers stacked on and contacting the first semiconductor layer of the another pair of semiconductor layers; and
implanting the second dopant into the second semiconductor layer of the another pair of semiconductor layers; and
etching the at least one pair of semiconductor layers to form a semiconductor fin.

13. The method of claim 12, wherein the first semiconductor layer of each of the at least one pair of semiconductor layers and the second semiconductor layer of each of the at least one pair of semiconductor layers are formed by depositing silicon or SiGe.

14. The method of claim 12, wherein a thickness ratio of the first semiconductor layer of each of the at least one pair of semiconductor layers to the second semiconductor layer of each of the at least one pair of semiconductor layers is substantially in a range from 0.01 to 100.

15. The method of claim 12, wherein an average ion concentration of the second semiconductor layer of each of the at least one pair of semiconductor layers that is greater than an average ion concentration of the first semiconductor layer of each of the at least one pair of semiconductor layers, and the second semiconductor layer of each of the at least one pair of semiconductor layers has an average boron concentration substantially in a range from $1 \times 10^{16}/cm^3$ to $1 \times 10^{20}/cm^3$, and the first semiconductor layer of each of the at least one pair of semiconductor layers has an average phosphorous concentration substantially in a range from $1 \times 10^{16}/cm^3$ to $1 \times 10^{20}/cm^3$.

16. The method of claim 12, further comprising:
forming an isolation layer on the semiconductor substrate, wherein the first semiconductor layer of the first pair of semiconductor layers is disposed over the isolation layer.

17. The method of claim 12, wherein the first dopant is the n type dopant, and the second dopant is the p type dopant, such that the second semiconductor layer is corresponding to a PMOS device.

18. The method of claim 12, wherein the first dopant is the p type dopant, and the second dopant is the n type dopant, such that the second semiconductor layer is corresponding to a NMOS device.

19. The method of claim 12, further comprising:
forming a gate oxide to cover side surfaces and top surface of the semiconductor fin;
forming a gate electrode to cover side surfaces and top surface of the gate oxide; and
forming source/drain portions respectively on the semiconductor fin adjacent to both sides of the gate electrode.

20. The method of claim 12, wherein the semiconductor device is a junctionless thin-film transistor (JL-TFT), a junctionless field effect transistor (JL-FET), an inversion mode TFT or FET, or an accumulation mode TFT or FET.

* * * * *